United States Patent
Ali et al.

(10) Patent No.: US 7,107,561 B2
(45) Date of Patent: Sep. 12, 2006

(54) METHOD OF SIZING VIA ARRAYS AND INTERCONNECTS TO REDUCE ROUTING CONGESTION IN FLIP CHIP INTEGRATED CIRCUITS

(75) Inventors: Anwar Ali, San Jose, CA (US); Wei Huang, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 161 days.

(21) Appl. No.: 10/914,657

(22) Filed: Aug. 9, 2004

(65) Prior Publication Data

US 2006/0027919 A1 Feb. 9, 2006

(51) Int. Cl.
G06F 17/50 (2006.01)
G06F 9/45 (2006.01)
(52) U.S. Cl. .......................................... 716/10; 716/13
(58) Field of Classification Search ................... 716/10, 716/13
See application file for complete search history.

(56) References Cited

U.S. PATENT DOCUMENTS

| | | | | |
|---|---|---|---|---|
| 5,547,740 A * | 8/1996 | Higdon et al. | ............... | 428/209 |
| 6,072,945 A * | 6/2000 | Aji et al. | ........................ | 716/5 |
| 6,378,109 B1 | 4/2002 | Young et al. | | |
| 6,499,131 B1 | 12/2002 | Savithri et al. | | |
| 6,689,634 B1 * | 2/2004 | Lyne | ........................... | 438/106 |
| 6,829,754 B1 * | 12/2004 | Yu et al. | ......................... | 716/5 |
| 6,857,113 B1 * | 2/2005 | Gentry et al. | ................... | 716/5 |
| 2001/0039644 A1 * | 11/2001 | Le Coz | ......................... | 716/11 |
| 2003/0229866 A1 * | 12/2003 | Allen et al. | ..................... | 716/5 |
| 2004/0098690 A1 * | 5/2004 | Joseph et al. | .................. | 716/12 |
| 2004/0163054 A1 * | 8/2004 | Frank et al. | .................... | 716/4 |
| 2004/0255258 A1 * | 12/2004 | Li | ................................. | 716/8 |
| 2004/0268275 A1 * | 12/2004 | Cappelletti et al. | ............ | 716/4 |

* cited by examiner

Primary Examiner—Paul Dinh
Assistant Examiner—Magid Y. Dimyan
(74) Attorney, Agent, or Firm—Eric J. Whitesell

(57) ABSTRACT

A method and computer program are disclosed for reducing routing congestion in an integrated circuit design that include steps of: (a) receiving as input a design for an integrated circuit die having an inner metal layer and a top metal layer wherein the design includes electrical constraints of each of a plurality of I/O circuits in the integrated circuit die; (b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits; and (c) generating as output the number of vias determined for the via array.

22 Claims, 4 Drawing Sheets

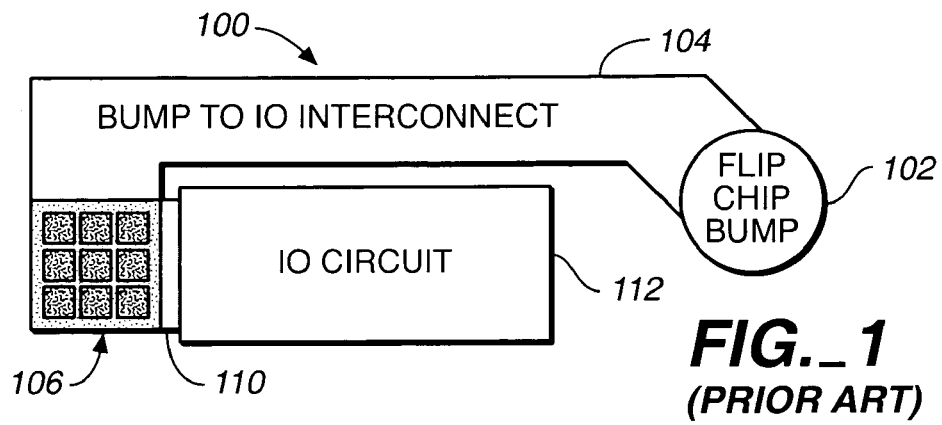
FIG._1
(PRIOR ART)
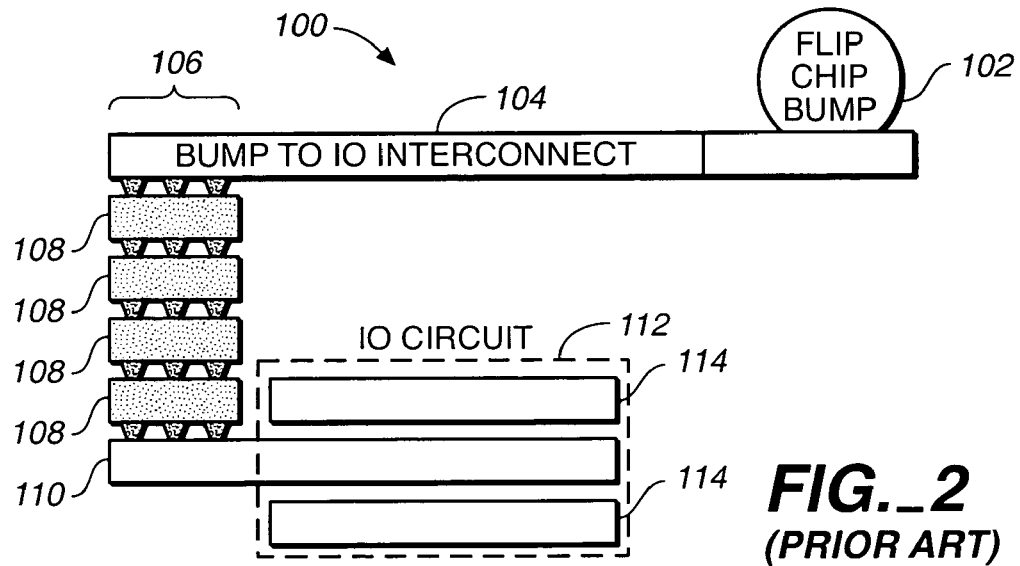
FIG._2
(PRIOR ART)
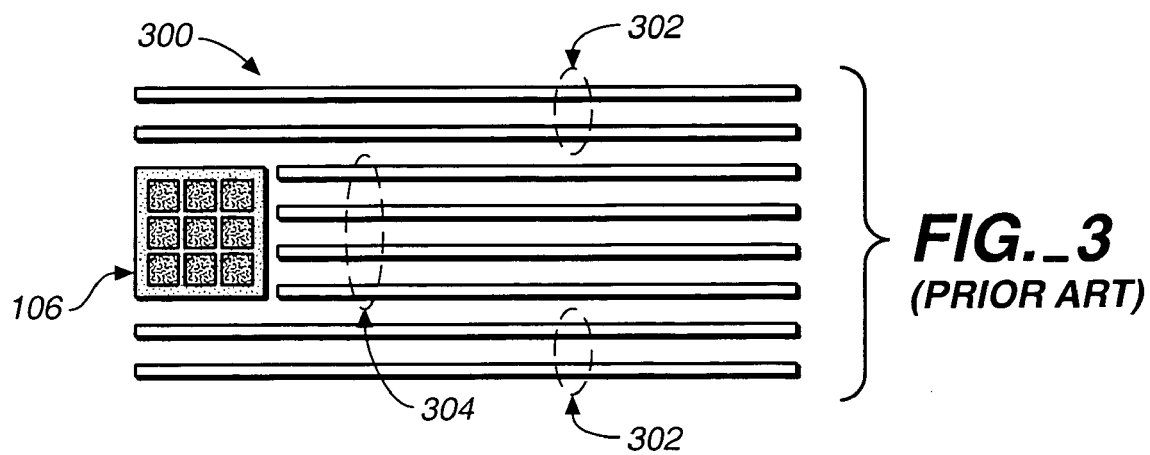
FIG._3
(PRIOR ART)

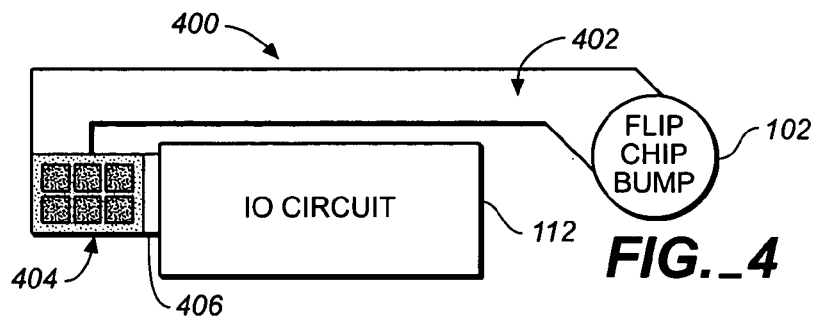
FIG._4
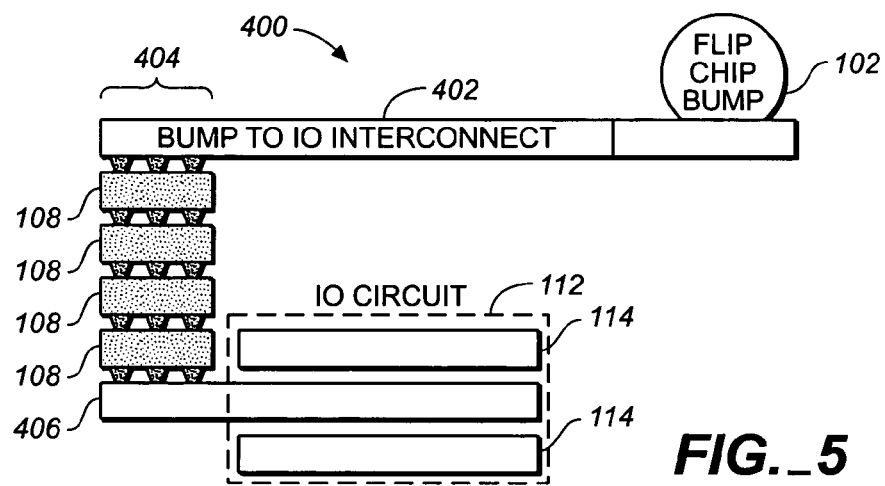
FIG._5
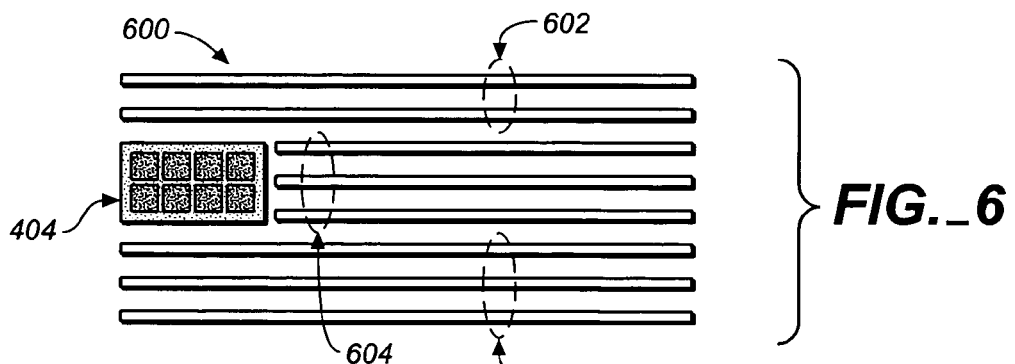
FIG._6
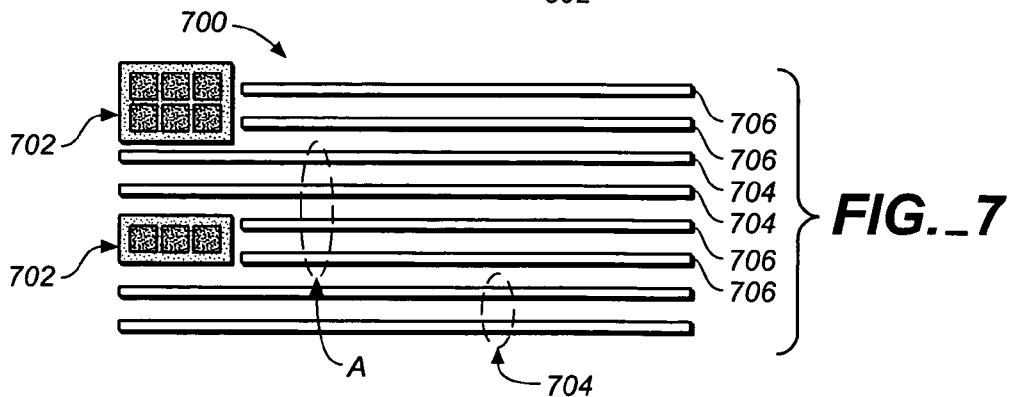
FIG._7

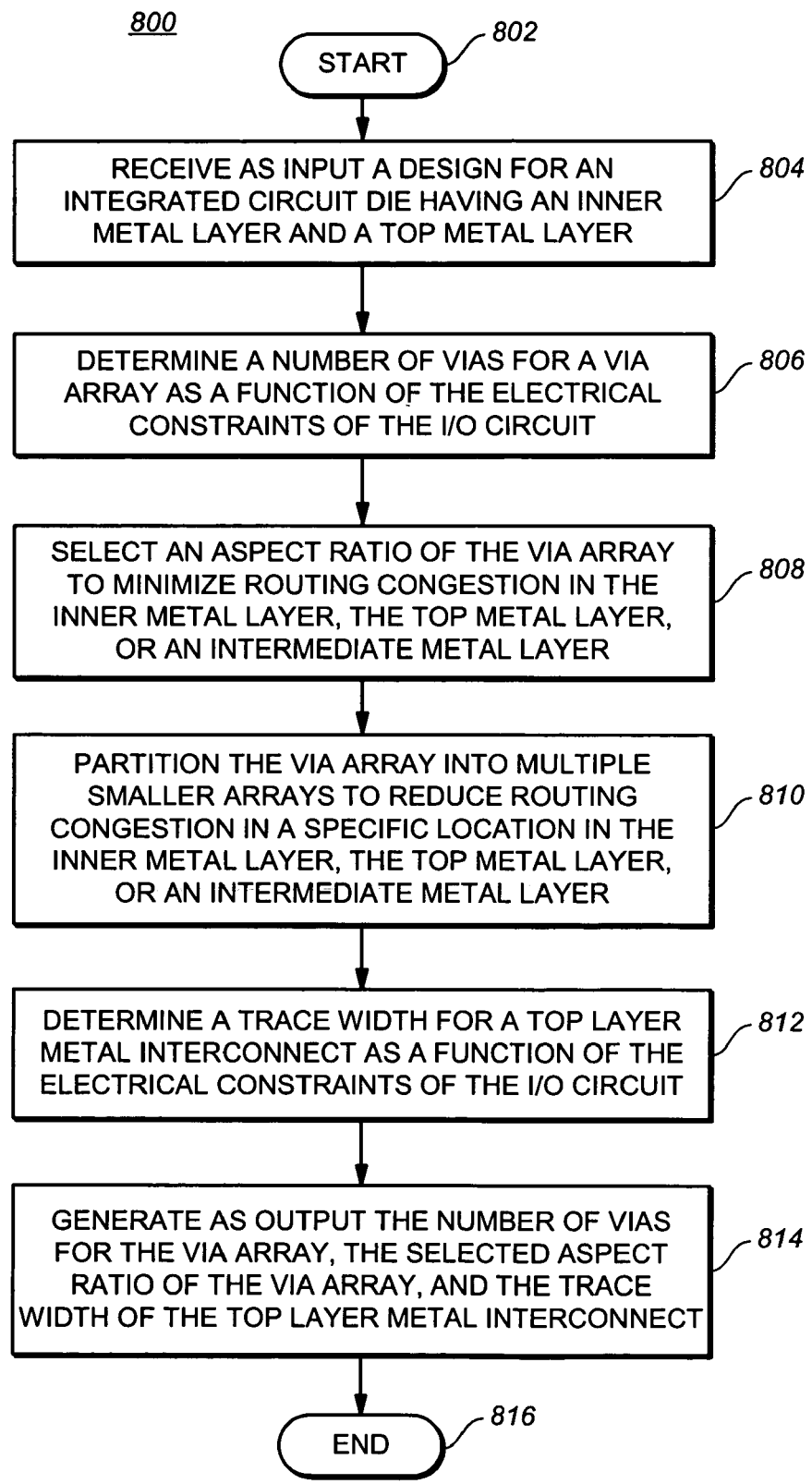
FIG._8

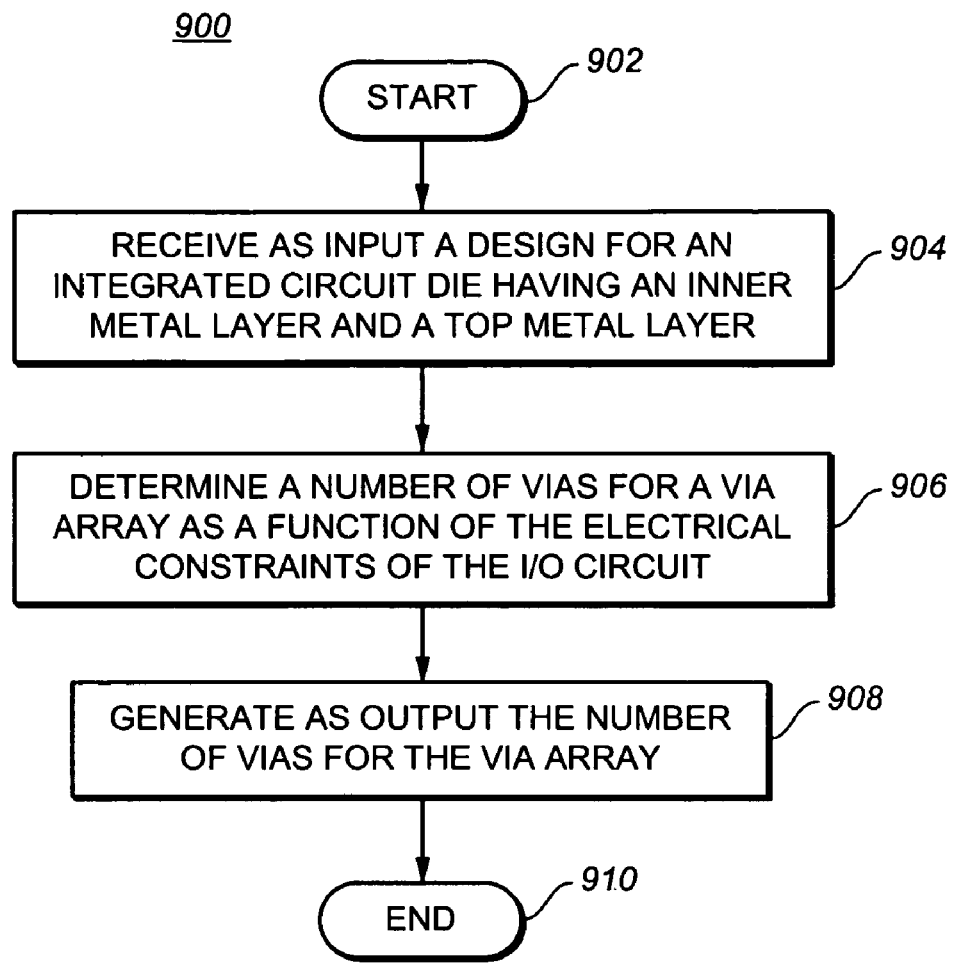
FIG._9

METHOD OF SIZING VIA ARRAYS AND INTERCONNECTS TO REDUCE ROUTING CONGESTION IN FLIP CHIP INTEGRATED CIRCUITS

BACKGROUND OF THE INVENTION

1. Field of the Invention

The present invention is directed to the manufacture of integrated circuits. More specifically, but without limitation thereto, the present invention is directed to the design of via arrays and interconnects for flip chip integrated circuits.

2. Description of the Prior Art

Connections between a flip chip integrated circuit die and a flip chip integrated circuit package are typically made by solder bumps formed on the top metal layer of the die. The solder bumps are connected to I/O circuits inside the die. Current methods for connecting I/O circuits inside the die to the solder bumps include forming via arrays that connect the top metal layer of the die to an inner metal layer of the die in which the wire traces to the I/O circuits are formed. The solder bumps are connected to the via arrays by wire traces formed in the top metal layer.

SUMMARY OF THE INVENTION

In one embodiment of the present invention, a method includes steps of:

(a) receiving as input a design for an integrated circuit die having an inner metal layer and a top metal layer wherein the design includes electrical constraints of each of a plurality of I/O circuits in the integrated circuit die;

(b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits; and (c) generating as output the number of vias determined for the via array.

In another aspect of the present invention, a computer program product for reducing routing congestion in an integrated circuit design includes a medium for embodying a computer program for input to a computer and a computer program embodied in the medium for causing the computer to perform steps of:

(a) receiving as input a design for an integrated circuit die having an inner metal layer and a top metal layer wherein the design includes electrical constraints of each of a plurality of I/O circuits in the integrated circuit die;

(b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits; and (c) generating as output the number of vias determined for the via array.

DESCRIPTION OF THE DRAWINGS

The present invention is illustrated by way of example and not limitation in the accompanying figures, in which like references indicate similar elements throughout the several views of the drawings.

FIG. 1 illustrates a top view of an I/O interconnect in an integrated circuit die of the prior art;

FIG. 2 illustrates a cross-sectional view of the I/O interconnect of FIG. 1;

FIG. 3 illustrates a top view of routing congestion in a horizontally routed metal layer in the integrated circuit die of FIG. 1;

FIG. 4 illustrates a top view of an I/O interconnect in an integrated circuit die according to an embodiment of the present invention;

FIG. 5 illustrates a cross-sectional view of the I/O interconnect of FIG. 4;

FIG. 6 illustrates reduced routing congestion in a horizontally routed metal layer in the integrated circuit die of FIG. 4;

FIG. 7 illustrates reduced routing congestion in a selected area of the horizontally routed metal layer of FIG. 6 using multiple via arrays;

FIG. 8 illustrates a flow chart of a method of reducing routing congestion in an integrated circuit according to an embodiment of the present invention; and FIG. 9 illustrates a flow chart for a method and computer program product for reducing routing congestion according to an embodiment of the present invention.

DESCRIPTION OF THE ILLUSTRATED EMBODIMENTS

The term "integrated circuit" is used herein to refer to a logic device, for example, an application specific integrated circuit (ASIC), an application specific standard product (ASSP), and an integrated circuit in which I/O devices are placed around and near the periphery of an integrated circuit die or across the entire area of the integrated circuit die. In a flip chip integrated circuit, solder bumps are formed on a top metal layer of the die that connect the die to the integrated circuit package.

An integrated circuit die includes several parallel electrically conductive metal layers that are separated by layers of insulating material. Each of the metal layers is etched or otherwise processed to produce a grid of horizontal or vertical routing tracks, also referred to as traces or wires, that are used to form electrical connections between separate locations in the integrated circuit die. Connections between the metal layers are made by forming electrically conductive vias in the insulating layers. The vias are typically formed as a via array having a standard number of vias selected, for example, by a maximum die current. In previous methods for forming via arrays, the same number of vias is used for every via array in the die.

FIG. 1 illustrates a top view of an I/O interconnect 100 in an integrated circuit of the prior art, and FIG. 2 illustrates a cross-sectional view of the I/O interconnect 100 of FIG. 1. Shown in FIGS. 1 and 2 are a flip chip solder bump 102, a top metal layer interconnect 104, a via array 106, intermediate metal layers 108, an inner metal layer interconnect 110, an I/O circuit 112, and I/O devices 114.

In FIGS. 1 and 2, the flip chip solder bump 102 is formed on the top metal layer interconnect 104 to electrically connect the I/O circuit 112 to an integrated circuit package (not shown). The top metal layer interconnect 104 is a wire trace that is formed in the top metal layer of the integrated circuit die to electrically connect the flip chip solder bump 102 to the via array 106. The via array 106 is a pattern of vias formed in each of the insulating layers between the intermediate metal layers 108 to electrically connect the top metal layer interconnect 104 to the inner metal layer interconnect 110. The inner metal layer interconnect 110 is a wire trace formed in an inner metal layer of the integrated circuit die to electrically connect the via array 106 to the I/O circuit 112. The I/O circuit 112 includes one or more I/O devices 114, for example, buffers and bus drivers, that are formed in a semiconductor layer of the integrated circuit die.

A disadvantage of the I/O interconnect 100 of FIGS. 1 and 2 is the lack of consideration given to selecting the number of vias in the via array 106 required to meet electromigration and voltage drop constraints. For example, if the number of vias is underdesigned, then the resulting high current density in each of the vias may result in a removal of conducting material from the vias, a phenomenon referred to as electromigration, that could result in a life expectancy of the die that is below a design minimum. Also, the resulting electrical resistance may result in a voltage drop that could cause the die to malfunction.

On the other hand, if the number of vias is overdesigned, then the larger area of the via array may result in unnecessary routing congestion in the top metal layer, the inner metal layer, and one or more of the intermediate metal layers.

FIG. 3 illustrates a top view of routing congestion in a horizontally routed metal layer 300 in the integrated circuit die of FIG. 1. Shown in FIG. 3 are a via array 106, non-blocked routing tracks 302, and blocked routing tracks 304.

In FIG. 3, the number of non-blocked routing tracks 302 that may be used to connect the left end of the integrated circuit die to the right end is reduced by the via array 106 that blocks the blocked routing tracks 304. The number of blocked routing tracks 304 and the corresponding routing congestion in the horizontally routed metal layer 300 is determined by the number of vias in each column of the via array 106.

Another disadvantage of the I/O interconnect 100 of FIGS. 1 and 2 is that in previous methods for designing via arrays, the orientation and aspect ratio, that is, the ratio of the number of vias in each row to the number of vias in each column, is not adjusted to reduce routing congestion.

In the example of FIG. 3, the blocked routing tracks 304 are formed in a horizontally routed metal layer, however, via arrays may also result in routing congestion due to blocked routing tracks formed in a vertically routed metal layer.

FIG. 4 illustrates a top view of an I/O interconnect 400 in an integrated circuit die according to an embodiment of the present invention, and FIG. 5 illustrates a cross-sectional view of the I/O interconnect 400 of FIG. 4. Shown in FIGS. 4 and 5 are a flip chip solder bump 102, intermediate metal layers 108, an I/O circuit 112, I/O devices 114, a top metal layer interconnect 402, a via array 404, and an inner metal layer interconnect 406.

In FIGS. 4 and 5, The flip chip solder bump 102 is formed on the top metal layer interconnect 402 to electrically connect the I/O circuit 112 to an integrated circuit package (not shown). The top metal layer interconnect 402 electrically connects the flip chip solder bump 102 to the via array 404. The via array 404 is a pattern of vias formed between each of the intermediate metal layers 108 to electrically connect the top metal layer interconnect 402 to the inner metal layer interconnect 406.

An important feature of the present invention is that the number of vias in each via array 404 is determined by the electrical constraints of the corresponding I/O circuit 112 instead of using a standard number of vias for all the via arrays. For example, if the maximum current of the I/O circuit 112 is less than the value of current used to determine the standard number of vias in the via array 106 in FIG. 1, then the number of vias in the via array 404 may be reduced while still satisfying the electromigration and voltage drop design requirements. Consequently, the number of vias in the via array 404 may be selected to carry the maximum current that may occur in the I/O circuit to achieve a level of electromigration and voltage drop that is within the specifications or electrical constraints of the integrated circuit design. The maximum current in each I/O circuit may be determined from the integrated circuit design information for the corresponding I/O circuit, for example, according to well-known computer programming techniques or from a table of maximum I/O current values generated during the integrated circuit design cycle and included in the integrated circuit design files. The reduced number of vias in the via array 404 advantageously reduces the routing congestion in the top metal layer and the intermediate metal layers of the integrated circuit die. The electrical constraints used to determine the number of vias for each corresponding I/O circuit include, for example, an electromigration constraint, a resistance constraint, a capacitance constraint, and an inductance constraint. The electrical constraints are determined according to well known techniques, for example, from circuit simulation analysis models, and may also be available from the integrated circuit design files.

Another important feature of the present invention is that the width of the top metal layer interconnect 402 and the inner metal layer interconnect 406 may also be selected to satisfy the electrical constraints of the corresponding I/O circuit 112 rather than using a standard width throughout the die. Reducing the width of the top metal layer interconnect 402 and the inner metal layer interconnect 406 increases the number of wires that may be routed in the top metal layer and the inner metal layer, advantageously reducing routing congestion.

Alternatively, the inner metal layer interconnect 406 may be partitioned into multiple narrower wire traces to reduce the routing congestion in the inner metal layer.

Yet another important feature of the present invention is that the aspect ratio of each via array 404 may be adjusted to reduce routing congestion in the top metal layer and the intermediate metal layers of the integrated circuit die. For example, if routing congestion is excessive in a horizontally routed metal layer, and if routing tracks are available in the vertically routed metal layers, then the via arrays may be arranged with fewer vias in each column and more vias in each row.

FIG. 6 illustrates reduced routing congestion in a horizontally routed metal layer 600 in the integrated circuit die of FIG. 4. Shown in FIG. 6 are a via array 404, non-blocked routing tracks 602, and blocked routing tracks 604.

In FIG. 6, the number of non-blocked routing tracks 602 that may be used to connect the left end of the integrated circuit die to the right end is increased by adjusting the aspect ratio of the via array 404 that blocks the blocked routing tracks 604. The number of blocked routing tracks 604 and the corresponding routing congestion in the horizontally routed metal layer 600 is reduced by arranging the via array 404 so that the via array 404 has fewer vias in each column than in each row. The aspect ratio is thereby increased, resulting in a higher number of non-blocked routing tracks 602 and a lower number of blocked routing tracks 604 compared to the arrangement of FIG. 3. The aspect ratio of each via array 402 may be advantageously adjusted to minimize routing congestion in all of the metal layers of the integrated circuit die including the top metal layer and the intermediate metal layers 108.

Alternatively, each via array 404 may be partitioned into multiple smaller via arrays to reduce routing congestion in a specific location of a metal layer of the integrated circuit die.

FIG. 7 illustrates reduced routing congestion 700 in a selected location of the horizontally routed metal layer 300 of FIG. 3 using multiple via arrays. Shown in FIG. 7 are multiple via arrays 702, non-blocked routing tracks 704, and blocked routing tracks 706.

In FIG. 7, the number of blocked routing tracks 706 in the location marked "A" is reduced from four to two compared to the arrangement of FIG. 3, while the number of blocked routing tracks 706 resulting from partitioning the single via array 402 into the multiple via arrays 702 remains about the same or slightly higher.

As may be appreciated from the method of the present invention described above, the routing congestion in an integrated circuit die may be advantageously reduced by selectively reducing the number of vias in each via array and reducing the width of the top and inner metal layer interconnects as a function of the electrical constraints defined by the integrated circuit design information files.

Alternatively, adjusting the aspect ratio of the via arrays or partitioning each via array into multiple smaller arrays can reduce routing congestion in a specific location of a metal layer of the integrated circuit die.

In one embodiment of the present invention, a method includes steps of:
(a) receiving as input a design for an integrated circuit die having an inner metal layer and a top metal layer wherein the design includes electrical constraints of each of a plurality of I/O circuits in the integrated circuit die;
(b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits; and
(c) generating as output the selected number of vias for the via array.

FIG. 8 illustrates a flow chart 800 of a method of reducing routing congestion in an integrated circuit according to an embodiment of the present invention.

Step 802 is the entry point of the flow chart 700.

In step 804, a design for an integrated circuit die having an inner metal layer and a top metal layer is received as input. The design includes the electrical constraints of each of the I/O circuits that are connected to the inner metal layer. The electrical constraints include, for example, an electromigration constraint, a resistance constraint, a capacitance constraint, and an inductance constraint.

In step 806, a number of vias for a via array is selected that satisfies the electrical constraints of a corresponding I/O circuit to form an electrical connection between the inner metal layer and the top metal layer of the integrated circuit die.

In step 808, an aspect ratio of the via array is selected to minimize routing congestion in the inner metal layer, the top metal layer, or an intermediate metal layer of the integrated circuit die.

In step 810, the via array is partitioned into multiple smaller arrays to reduce routing congestion in a specific location in the inner metal layer, the top metal layer, or an intermediate metal layer of the integrated circuit die.

In step 812, a trace width is selected for a top layer metal interconnect or an inner metal layer interconnect that satisfies the electrical constraints of the corresponding I/O circuit to connect the I/O circuit to a solder bump formed on the top metal layer.

In step 814, the selected number of vias for the via array, the selected aspect ratio of the via array, and the selected trace width are generated as output.

Step 816 is the exit point of the flow chart 800.

In another embodiment of the present invention, a computer program product for reducing routing congestion in an integrated circuit design includes a medium for embodying a computer program for input to a computer and a computer program embodied in the medium for causing the computer to perform steps of:
(a) receiving as input a design for an integrated circuit die having an inner metal layer and a top metal layer wherein the design includes electrical constraints of each of a plurality of I/O circuits in the integrated circuit die;
(b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits; and
(c) generating as output the selected number of vias for the via array.

FIG. 9 illustrates a flow chart 800 for a method and computer program product for reducing routing congestion according to an embodiment of the present invention.

Step 900 is the entry point of the flow chart 900.

In step 902, a design for an integrated circuit die having an inner metal layer and a top metal layer is received as input. The design includes electrical constraints of an I/O circuit connected to the inner metal layer as described above.

In step 904, a number of vias for a via array is selected to form an electrical connection between the inner metal layer and the top metal layer of the integrated circuit die wherein the number of vias is selected to satisfy the electrical constraints of the I/O circuit.

In step 906, the selected number of vias for the via array is generated as output.

Step 908 is the exit point of the flow chart 900.

In further embodiments, the method and computer program described in the flow chart 900 of FIG. 9 may include steps for selecting an aspect ratio of the via array to minimize routing congestion in the top metal layer, an intermediate metal layer, and the inner metal layer; partitioning the via array into smaller via arrays to reduce the routing congestion in a specific location in the top metal layer, an intermediate metal layer, and the inner metal layer; and selecting a trace width for a top layer metal interconnect or an inner metal layer interconnect that satisfies the electrical constraints of the I/O circuit to connect the I/O circuit to a solder bump formed on the top metal layer, and generating as output the selected aspect ratio of the via array and the selected trace width.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method comprising steps of:
   (a) receiving as input a design for an integrated circuit die having an inner metal layer and a top metal layer wherein the design includes electrical constraints of each one of a plurality of I/O circuits in the integrated circuit die;
   (b) selecting a number of vias to form a via array between an interconnect in the inner metal layer and an interconnect in the top metal layer of the integrated circuit die to electrically connect a solder bump formed on the top metal layer to one of the plurality of I/O circuits wherein the number of vias is selected to satisfy the electrical constraints of each one of the plurality of I/O circuits separately from a number of vias selected to satisfy the electrical constraints of each other one of the plurality of I/O circuits; and
   (c) generating as output the selected number of vias for the via array.

2. The method of claim 1 further comprising a step of selecting an aspect ratio of the via array to minimize routing congestion.

3. The method of claim 2 further comprising a step of generating as output the selected aspect ratio.

4. The method of claim 2 wherein the aspect ratio of the via array is selected to minimize routing congestion in an intermediate metal layer of the integrated circuit.

5. The method of claim 4 wherein the intermediate metal layer is a horizontally routed metal layer or a vertically routed metal layer.

6. The method of claim 1 further comprising a step of selecting a trace width that satisfies the electrical constraints of the corresponding one of the plurality of I/O circuits for forming a wire trace in the top metal layer to connect the corresponding one of the plurality of I/O circuits to a solder bump formed on the top metal layer.

7. The method of claim 6 further comprising a step of generating the selected trace width as output.

8. A method comprising steps of:
   (a) receiving as input a design for an integrated circuit die having an inner metal layer and a top metal layer wherein the design includes electrical constraints of each of a plurality of I/O circuits in the integrated circuit die;
   (b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits;
   (c) generating as output the selected number of vias for the via array; and
   (d) partitioning the via array into multiple via arrays.

9. The method of claim 8 further comprising a step of selecting an aspect ratio for at least one of the multiple via arrays to minimize routing congestion.

10. A method comprising steps of:
    (a) receiving as input a design for an integrated circuit die having an inner metal layer and a top metal layer wherein the design includes electrical constraints of each of a plurality of I/O circuits in the integrated circuit die;
    (b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits;
    (c) generating as output the selected number of vias for the via array;
    (d) selecting a trace width that satisfies the electrical constraints of the corresponding one of the plurality of I/O circuits for forming a wire trace in the top metal layer to connect the corresponding one of the plurality of I/O circuits to a solder bump formed on the top metal layer; and
    (e) partitioning the wire trace into multiple wire traces.

11. A method comprising steps of:
    (a) receiving as input a design for an integrated circuit die having an inner metal layer and a top metal layer wherein the design includes electrical constraints of each of a plurality of I/O circuits in the integrated circuit die;
    (b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits;
    (c) generating as output the selected number of vias for the via array; and
    (d) partitioning the via array into multiple via arrays to reduce routing congestion in a specific location of one of the inner metal layer and the top metal layer.

12. A computer program product for reducing routing congestion in an integrated circuit design comprising a medium for embodying a computer program for input to a computer and a computer program embodied in the medium for causing the computer to perform steps of:
    (a) receiving as input a design for an integrated circuit die having an inner metal layer and a top metal layer wherein the design includes electrical constraints of each one of a plurality of I/O circuits in the integrated circuit die;
    (b) selecting a number of vias to form a via array between an interconnect in the inner metal layer and an interconnect in the top metal layer of the integrated circuit die to electrically connect a solder bump formed on the top metal layer to one of the plurality of I/O circuits wherein the number of vias is selected to satisfy the electrical constraints of each one of the plurality of I/O circuits separately from a number of vias selected to satisfy the electrical constraints of each other one of the plurality of I/O circuits; and
    (c) generating as output the selected number of vias for the via array.

13. The computer program product of claim 12 further comprising a step of selecting an aspect ratio of the via array to minimize routing congestion.

14. The computer program product of claim 13 further comprising a step of generating as output the selected aspect ratio.

15. The computer program product of claim 13 wherein the aspect ratio of the via array is selected to minimize routing congestion in an intermediate metal layer of the integrated circuit.

16. The computer program product of claim 15 wherein the intermediate metal layer is a horizontally routed metal layer or a vertically routed metal layer.

17. The computer program product of claim 12 further comprising a step of selecting a trace width that satisfies the electrical constraints of the corresponding one of the plurality of I/O circuits for forming a wire trace in the top metal layer that connects the via array to a solder bump formed on the top metal layer.

18. The computer program product of claim 17 further comprising a step of generating the trace width as output.

19. A computer program product for reducing routing congestion in an integrated circuit design comprising a medium for embodying a computer program for input to a computer and a computer program embodied in the medium for causing the computer to perform steps of:
 (a) receiving as input a design for an integrated circuit die having an inner metal layer and a top metal layer wherein the design includes electrical constraints of each of a plurality of I/O circuits in the integrated circuit die;
 (b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits;
 (c) generating as output the selected number of vias for the via array; and
 (d) partitioning the via array into multiple via arrays.

20. The computer program product of claim 19 further comprising a step of selecting an aspect ratio for at least one of the multiple via arrays to minimize routing congestion.

21. A computer program product for reducing routing congestion in an integrated circuit design comprising a medium for embodying a computer program for input to a computer and a computer program embodied in the medium for causing the computer to perform steps of:
 (a) receiving as input a design for an integrated circuit die having an inner metal layer and a top metal layer wherein the design includes electrical constraints of each of a plurality of I/O circuits in the integrated circuit die;
 (b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits;
 (c) generating as output the selected number of vias for the via array;
 (d) selecting a trace width that satisfies the electrical constraints of the corresponding one of the plurality of I/O circuits for forming a wire trace in the top metal layer that connects the via array to a solder bump formed on the top metal layer; and
 (e) further comprising a step of partitioning the wire trace into multiple wire traces.

22. A computer program product for reducing routing congestion in an integrated circuit design comprising a medium for embodying a computer program for input to a computer and a computer program embodied in the medium for causing the computer to perform steps of:
 (a) receiving as input a design for an integrated circuit die having an inner metal layer and a top metal layer wherein the design includes electrical constraints of each of a plurality of I/O circuits in the integrated circuit die;
 (b) selecting a number of vias for a via array to form an electrical connection between the inner metal layer and the top metal layer of the integrated circuit die that connects a solder bump formed on the top metal layer to a corresponding one of the plurality of I/O circuits wherein the number of vias is selected to satisfy the electrical constraints of the corresponding one of the plurality of I/O circuits;
 (c) generating as output the selected number of vias for the via array; and
 (d) partitioning the via array into multiple via arrays to reduce routing congestion in a specific location of one of the inner metal layer and the top metal layer.

* * * * *